(12) United States Patent
Wright et al.

(10) Patent No.: US 6,486,713 B2
(45) Date of Patent: Nov. 26, 2002

(54) DIFFERENTIAL INPUT BUFFER WITH AUXILIARY BIAS PULSER CIRCUIT

(75) Inventors: Jeffrey P. Wright, Boise, ID (US); Alan J. Wilson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/790,525

(22) Filed: Feb. 23, 2001

(65) Prior Publication Data

US 2002/0118592 A1 Aug. 29, 2002

(51) Int. Cl.$^7$ .................................................. H03K 3/00
(52) U.S. Cl. ......................... 327/108; 327/333; 327/434
(58) Field of Search .......................... 327/108–112, 333, 327/434, 437; 326/21, 27, 81, 82

(56) References Cited

U.S. PATENT DOCUMENTS 5,404,057 A * 4/1995 Hasegawa .................. 326/57
6,239,613 B1 * 5/2001 Reddy et al. ............... 327/58

* cited by examiner

Primary Examiner—Kenneth B. Wells
(74) Attorney, Agent, or Firm—Dickstein Shapiro Morin & Oshinsky LLP

(57) ABSTRACT

An integrated circuit clock buffer is described which includes a pulser circuit having a delayed feedback to provide a pulsed signal in response to a transition in the external clock signal. The pulser circuit includes a delay element having an output node coupled to the input node of an inverter. The delay element and inverter are coupled between a first and second transistor. The buffer circuit generates non-skewed internal clock signals.

26 Claims, 6 Drawing Sheets

DIFFERENTIAL INPUT BUFFER WITH AUXILIARY BIAS PULSER CIRCUIT

FIELD OF THE INVENTION

The present invention relates generally to integrated circuits and in particular the present invention relates to differential input buffer circuits.

DISCUSSION OF THE RELATED ART

Synchronous integrated circuits operate according to an externally supplied clock signal. Internal circuit functions are performed in response to transitions of the clock signal. A differential buffer circuit is typically provided to monitor the clock input signal and produce an output signal indicating the detection of a transition in the clock signal. These differential buffer circuits can also produce complementary output signals where one signal follows the clock signal, and the second signal follows the inverse of the clock signal. These complementary output signals are susceptible to skew. As such, circuitry operating in response to the output signals may require a buffer circuit to reduce the effects of the signal skew.

Referring to the drawings, FIGS. 1 and 2 show a differential buffer circuit generally designated by the numeral 1. Circuit 1 includes p-channel pull-up transistors 3, 7, 5, 15. Circuit 1 also includes n-channel pull-down transistors 9, 11, 13. Circuit 1 further includes a multiplexer 17 connected to bias node 19. Transistor 3 has a source connected to a positive supply voltage Vcc and a drain connected to the bias node 19. The gates of transistors 7 and 9 are connected in common at bias node 19. The gates of transistors 5 and 11 are connected in common at node 21. The gates of transistors 15 and 13 are connected to Vin at node 27. The drain of transistor 7 is connected to the drain of transistor 9 at node 25. The source of transistor 7 is connected to the drain of transistor 5 and the source of transistor 15 at node 29. The source of transistor 5 is connected to a positive supply voltage Vcc. The drains of transistors 15 and 13 are connected to Vout at node 23. The source of transistor 13 is connected to the drain of transistor 11 and the source of transistor 9 at node 31. The source of transistor 11 is connected to the system ground Vss.

When circuit 1 is in power down mode (EN low state), Vcc is applied to the bias node 19 through transistor 3 while the multiplexor 17 is turned off. At this point, p-channel transistor 7 is off while the n-channel transistor 9 is turned on. When circuit 1 exits powerdown (EN high state), the bias node 19 starts to decay down to a midpoint 18, as shown in FIG. 2. Accordingly, due to the bias's slow decay, the trip point of the buffer circuit 1 is lowered when Vin goes to a high state on the first valid command. This causes an initial premature rising clock edge 20. Hence, by the time the next Vin high arrives, the bias node 19 should be stabilzed and the clock duty cycle becomes symmetrical.

This initial trip point is undesirable since variations in the trip point of a buffer or erroneous changes in state can result in very significant timing errors. This is particularly true in view of the fact that the buffer is frequently used as the first gate on a chip which receives signals external to the chip. For example, in high speed devices, a class of circuits is used that is commonly referred to as Address Transition Detection (ATD) circuits. If the output of a buffer driving an ATD were to change state as a result of voltage variations on the supply line, for example, the ATD would incorrectly initiate a sequence of events in the chip. Hence, these events would disrupt operation of the chip thereby resulting in the creation of more voltage variations and incorrect results.

Hence, what is needed is a differential buffer circuit which overcomes the above-noted shortcomings of conventional differential buffer circuits.

SUMMARY OF THE INVENTION

The present invention provides a differential buffer circuit which can be precisely set and is stable with respect to voltage variations while reducing signal skew between output signals. The present invention provides a selectively enabled differential buffer circuit which relies on a bias voltage at a bias node during operation and which includes a pulser circuit which provides a pulsed signal to the bias node in response to an enabling signal for the buffer circuit. The pulser circuit enables the bias node to quickly come to a desired operating voltage when the buffer circuit is first enabled to avoid skewed output signals which might otherwise occur during initial operation of the enabled buffer circuit.

The above advantages and features of the invention will be more clearly understood from the following detailed description which is provided in connection with the accompanying drawings.

DETAILED DESCRIPTION OF THE INVENTION

Figure 1:
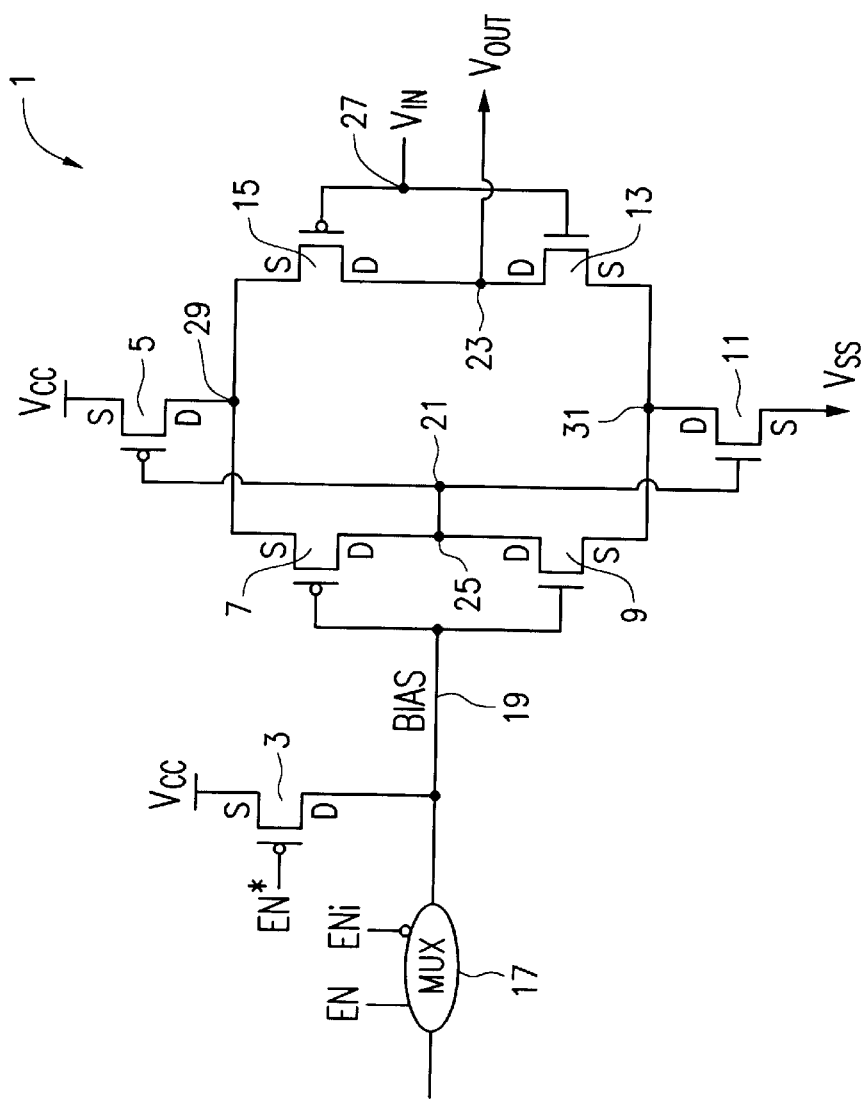
FIG. 1 is a prior art differential input buffer circuit.

The present invention will be described in connection with an exemplary embodiment of a buffer circuit as illustrated in FIGS. 3–6. Other embodiments may be utilized and structural or logical changes may be made without departing from the spirit or scope of the present invention. Like items are referred to by like reference numerals throughout the drawings.

Figure 3:
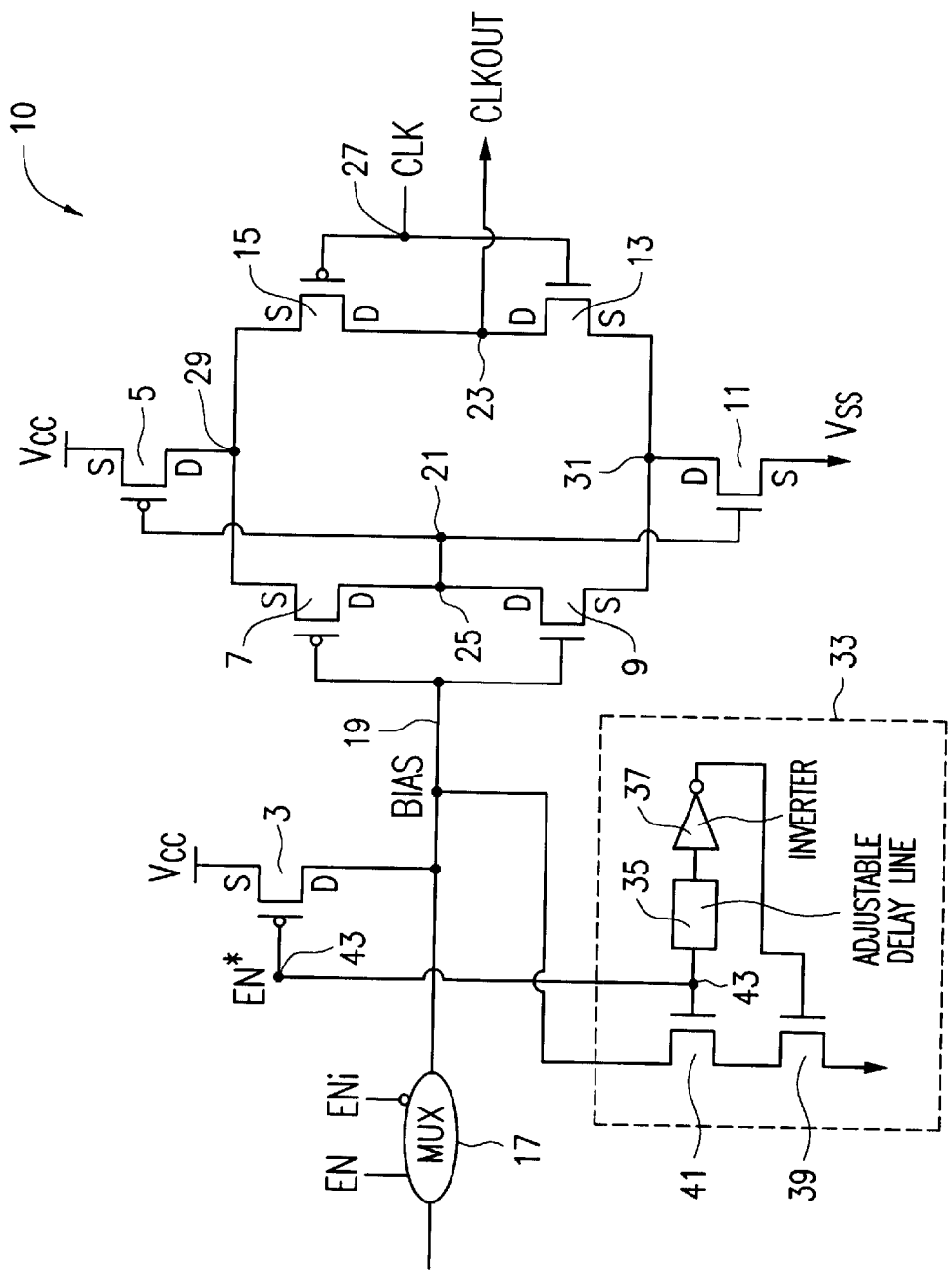
FIG. 3 is a schematic diagram of a differential buffer circuit of the present invention.

Referring to FIG. 3, a differential buffer circuit 10 according to the present invention is described. Parts of the invention previously described will not be repeated here. For purposes of describing the FIG. 3 circuit, it will be assumed that the input signal is a clock signal CLK and that an output signal CLKOUT is provided. Circuit 10 receives the clock input signal CLK at node 27 and produces a clock output signal CLKOUT at node 23. During powerdown, EN* is low and Vcc is applied through transistor 3 to bias node 19 while the multiplexor 17 is turned off. The multiplexor 17 is connected to other circuitry not necessary to the description of the present invention and will not be described here. Transistor 7 holds the bias node 19 to Vcc depending on the state of CLK. As indicated, when circuit 10 exits powerdown (EN* high state), the bias node 19 starts to decay down to a midpoint causing the trip point of the buffer circuit 10 to be lowered when CLK goes to a high state on the first valid command.

Figure 4:
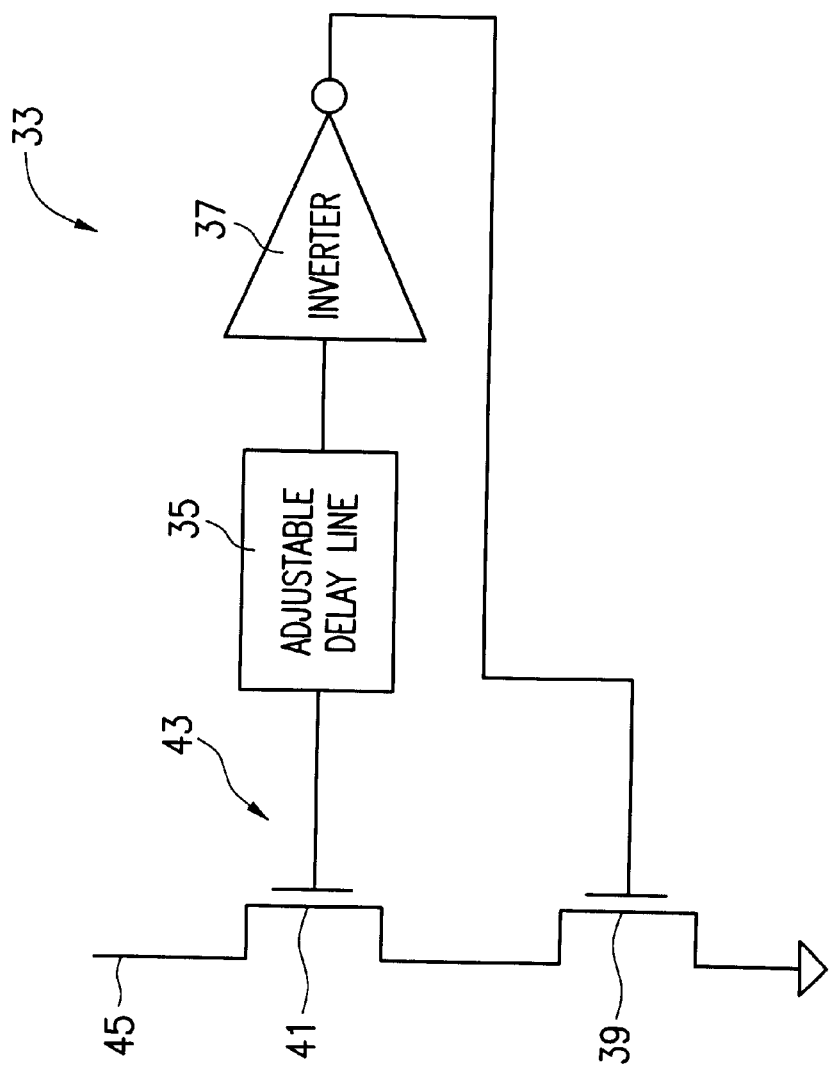
FIG. 4 is a schematic diagram of a pulser circuit incorporated in the differential buffer circuit of FIG. 3.

Prior to further describing the operation of the circuit of FIG. 3, a pulser circuit 33 is described with reference to FIG. 4. Pulser circuit 33 has an input node 43, and output node 45. A delay element 35 and an inverter 37 are coupled between transistors 41, 39. The delay time of element 35 is preferably about 3 to 5 nanoseconds, but can be varied over a wide range. In operation, transistor 39 is off while enable signal EN* is in a high state (normal operation) and transistor 41 is on. During power down (low state) transistor 41 is off and transistor 39 is on. Hence, a pulse is created when the enable signal EN first returns to a high state as both transistors 41 and 39 are temporarily on to pulse the bias node 19 to help the node reach its stable midrange position. After the delay set by the delay element 35, transistor 39 turns off sending the pulse signal of node 43. The delay created by delay element 35 is adjustable and the potential being pulsed through transistors 39, 41 is not limited to ground.

Figure 2:
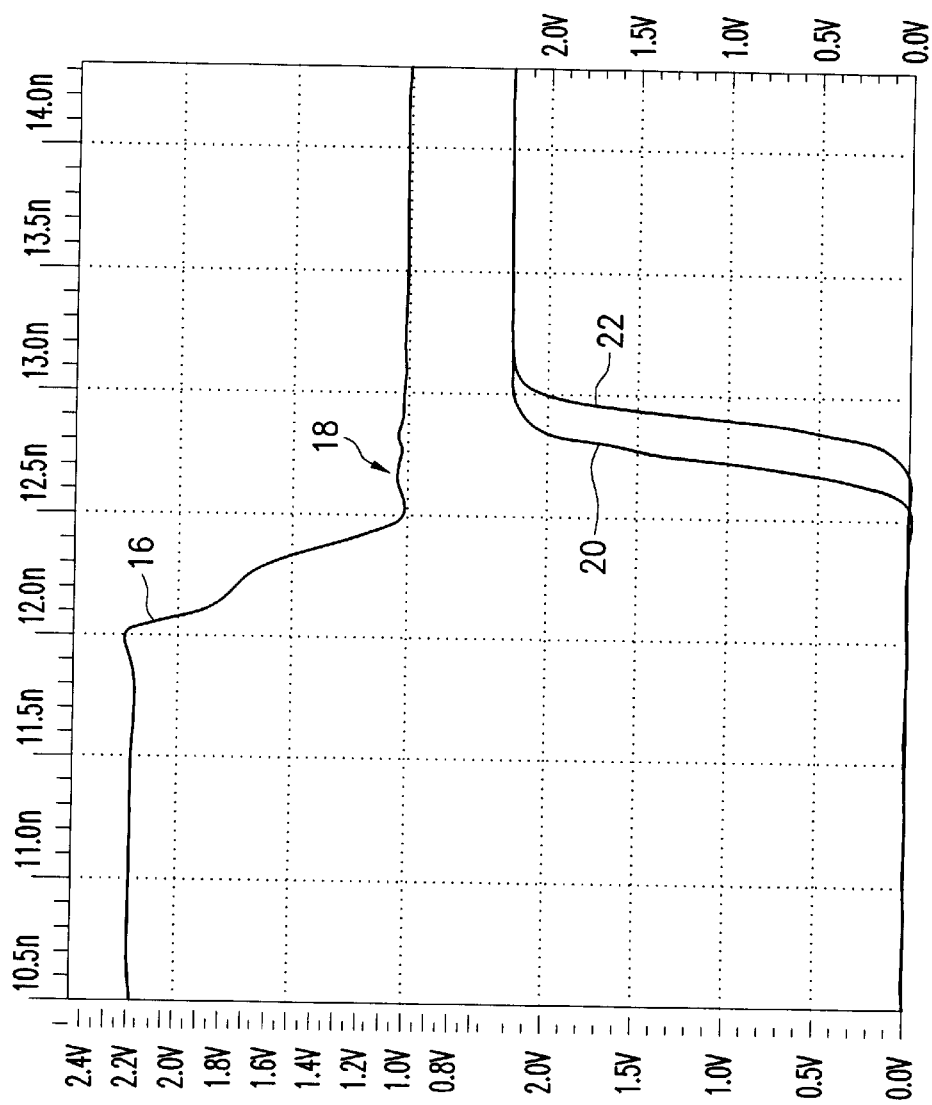
FIG. 2 illustrates the bias node and resulting internal clock for the buffer circuit of FIG. 1.
Figure 5:
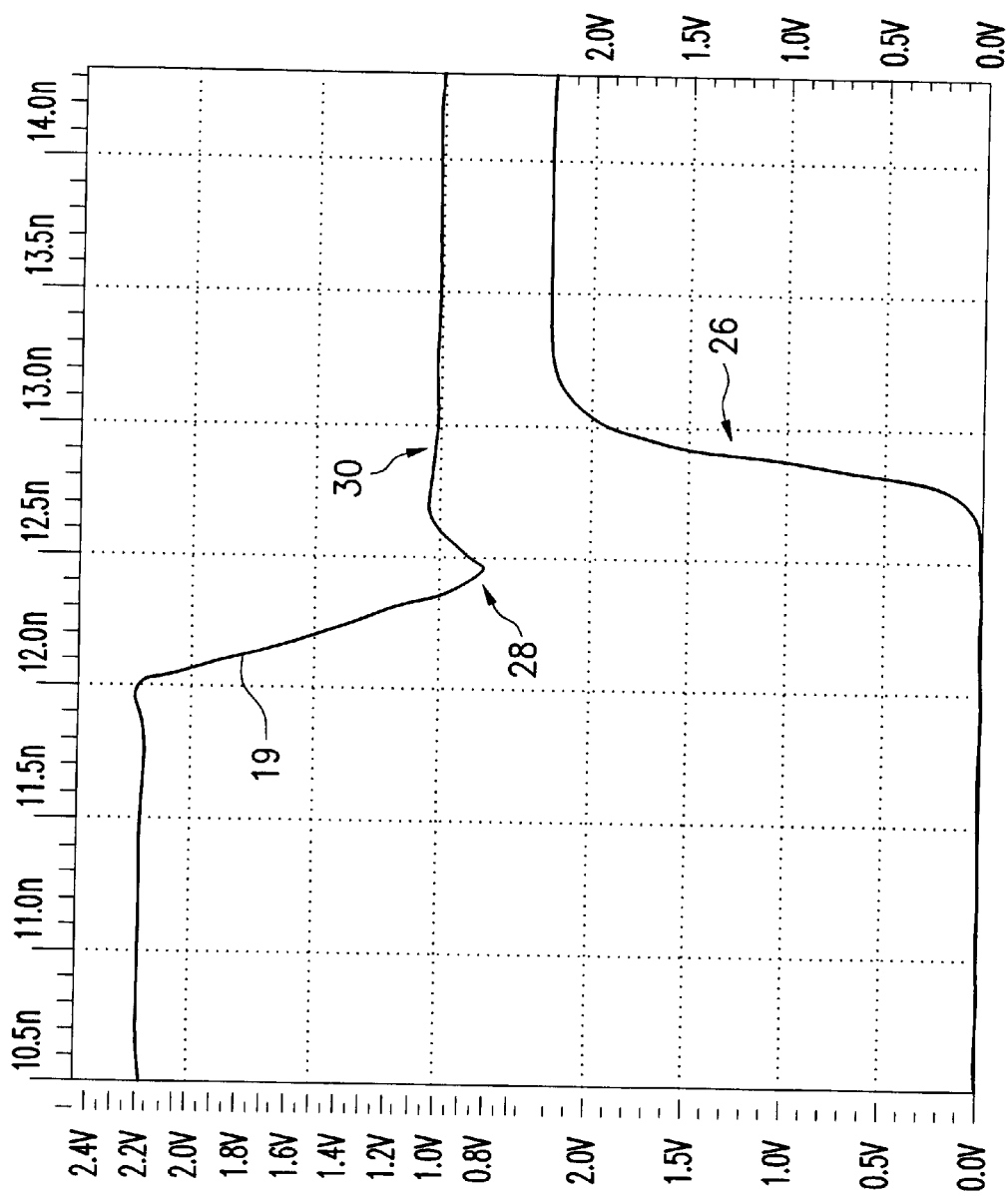
FIG. 5 illustrates the bias node and resulting internal clock for the differential buffer circuit of FIG. 3.

Referring now to FIG. 5, when circuit 100 is in power-down mode the bias node 19 is allowed to leak up to Vcc. At this point, the pulser circuit 33 is turned off. When power up occurs, the enable signal EN* toggles, shutting of the keeper devices and turns on the pulser circuit 33 which momentarily pulses the node 19 toward ground 28 helping the node reach its stable midrange position 30. Also, note that clock 20 (FIG. 2) trips at a later point, thus, eliminating the clock skew. In other words, clock 20 and clock 22 (FIG. 2) are precisely line on line with each other at 26. The command setup times are then unchanged from exiting power down to normal operation.

Figure 6:
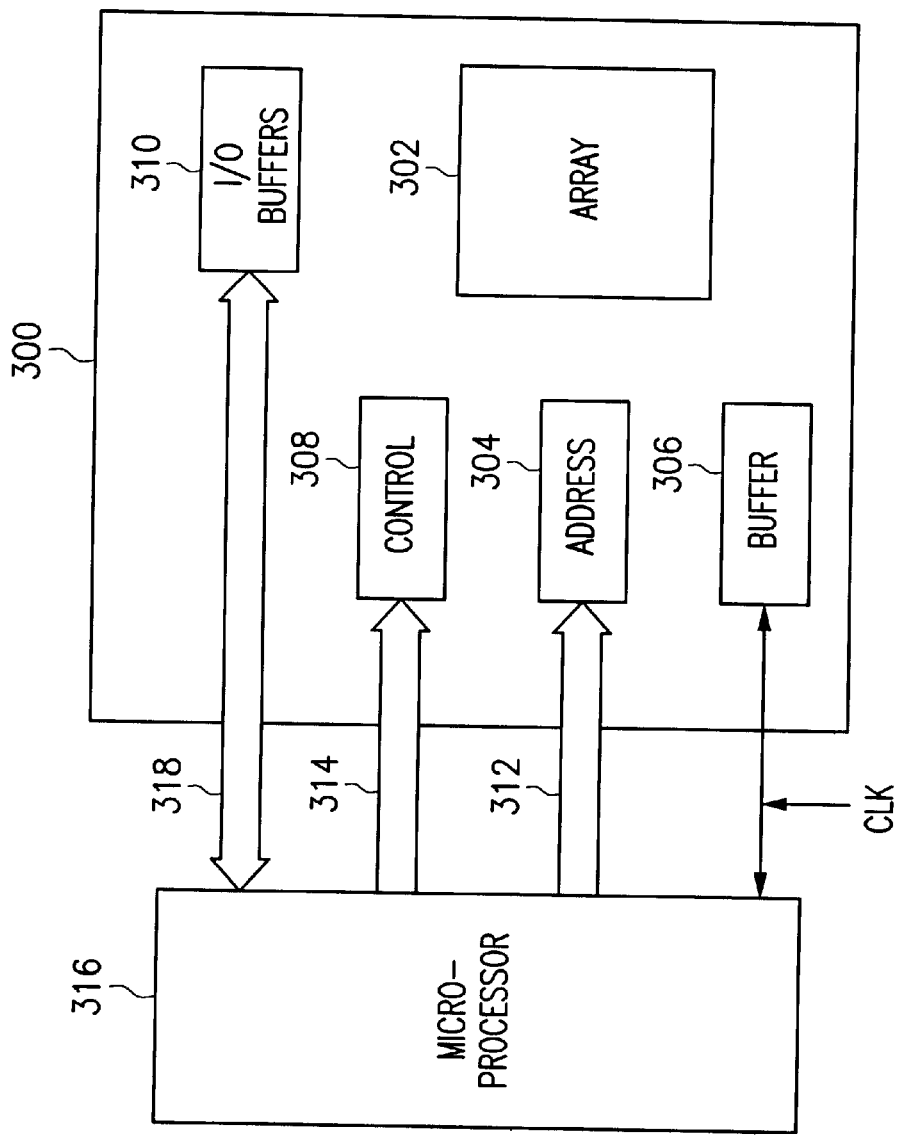
FIG. 6 is a block diagram of a synchronous memory device incorporating the present invention.

The above described differential input buffers are particularly useful in an integrated memory circuit. In particular, the input buffer is useful in synchronous memory devices such as a synchronous dynamic random access memory (SDRAM). A simplified block diagram of an SDRAM 300 is illustrated in FIG. 6. The SDRAM includes an array of memory cells 302, address circuitry 304 for addressing the memory array, a differential input buffer 306 for receiving a clock signal (CLK), and control circuitry 308 for controlling the operation of the memory device. The differential input buffer 306 includes the circuitry described above for reducing clock skew. Input/output (I/O) buffer circuitry 310 is provided for data input and output. An external processor 316 is typically used to provide control signals on lines 314, address signals on lines 312, and transmit and receive data on lines 318. It will be appreciated by those skilled in the art that the SDRAM of FIG. 6 is simplified to illustrate the present invention and is not intended to be a detailed description of all of the features of an SDRAM. It should also be understood that while a single SDRAM device is shown in FIG. 6, that in practice there will be a plurality of SDRAM devices connected to processor 316 and that one or more SDRAM devices may be contained on a memory module.

Hence, the present invention describes an integrated circuit clock buffer which includes a pulser circuit having a delayed feedback to provide a pulsed signal in response to a transition in the external clock signal. The pulser circuit includes a delay element having an output node coupled to the input node of an inverter. The delay element and inverter are coupled between a first and second transistor. The clock buffer may further include output circuits for generating internal clock signals in response to an externally provided clock signal. The buffer circuit generates non-skewed internal clock signals.

Although the invention has been described above in connection with exemplary embodiments, it is apparent that many modifications and substitutions can be made without departing from the spirit or scope of the invention. Accordingly, the invention is not to be considered as limited by the foregoing description, but is only limited by the scope of the appended claims.

What is claimed as new and desired to be protected by Letters Patent of the United States is:

1. A buffer circuit comprising:
   a first input node for receiving a digital signal;
   a controllable buffer circuit coupled to the first input node responsive to an enable signal, the controllable buffer circuit providing an output signal in response to the digital signal when the enable signal is in a first state, and the controllable buffer circuit being disabled when the enable signal is in a second state, said buffer circuit having a bias node; and
   a pulser circuit coupled to said bias node for providing a pulse signal to said bias node in response to said enable signal switching to said first state, wherein said pulser circuit comprises a first and second transistor connected in series between said bias node and a source of potential, said first transistor directly receiving said enable signal at a gate thereof, said second transistor receiving said enable signal at a gate thereof after it passes through at least a delay element.

2. The buffer circuit of claim 1 wherein said first transistor is on and said second transistor is off while said enable signal is in a second state.

3. The buffer circuit of claim 1 wherein said first transistor is off and said second transistor is on while said enable signal is in a first state.

4. The buffer circuit of claim 1 wherein said pulser circuit creates a pulse when said enable signal returns to said first state.

5. The buffer circuit of claim 1 wherein said pulser circuit further comprises an inverter connected to said delay element.

6. The buffer circuit of claim 1 wherein a delay time of said delay element is adjustable.

7. The buffer circuit of claim 6 wherein said delay time is about 3 to 5 nanoseconds.

8. A memory device comprising:
   a memory array containing a plurality of memory cells; and
   a buffer circuit comprising:
      a first input node for receiving a digital signal;
      a controllable buffer circuit coupled to the first input node responsive to an enable signal, the controllable buffer circuit providing an output signal in response to the digital signal when the enable signal is in a first state, and the controllable buffer circuit being disabled when the enable signal is in a second state said buffer circuit having a bias node; and
      a pulser circuit coupled to said bias node for providing a pulse signal to said bias node in response to said enable signal switching to said first state, wherein said pulser circuit comprises a first and second transistor connected in series between said bias node and a source of potential, said first transistor directly receiving said enable signal at a gate thereof, said second transistor receiving said enable signal at a gate thereof after it passes through at least a delay element.

9. The memory device of claim 8 wherein said first transistor is on and said second transistor is off while said enable signal is in a second state.

10. The memory device of claim 8 wherein said first transistor is off and said second transistor is on while said enable signal is in a first state.

11. The memory device of claim 8 wherein said pulser circuit creates a pulse when said enable signal returns to said first state.

12. The memory device of claim 8 wherein said pulser circuit further comprises an inverter connected to said delay element.

13. The memory device of claim 8 wherein a delay time of said delay element is adjustable.

14. The memory device of claim 13 wherein said delay time is about 3 to 5 nanoseconds.

15. A processor based system comprising:

a central processing unit;

a memory device coupled to said central processing unit to receive data from and supply data to said central processing unit, said memory device comprising:

a buffer circuit comprising:

a first input node for receiving a digital signal;

a controllable buffer circuit coupled to the first input node responsive to an enable signal, the controllable buffer circuit providing an output signal in response to the digital signal when the enable signal is in a first state, and the controllable buffer circuit being disabled when the enable signal is in a second state said buffer circuit having a bias node; and a pulser circuit coupled to said bias node for providing a pulse signal to said bias node in response to said enable signal switching to said first state, wherein said pulser circuit comprises a first and second transistor connected in series between said bias node and a source of potential, said first transistor directly receiving said enable signal at a gate thereof, said second transistor receiving said enable signal at a gate thereof after it passes through at least a delay element.

16. The processor based system of claim 15 wherein said first transistor is on and said second transistor is off while said enable signal is in a second state.

17. The processor based system of claim 15 wherein said first transistor is off and said second transistor is on while said enable signal is in a first state.

18. The processor based system of claim 15 wherein said pulser circuit creates a pulse when said enable signal returns to said first state.

19. The processor based system of claim 15 wherein said pulser circuit further comprises an inverter connected to said delay element.

20. The processor based system of claim 15 wherein a delay time of said delay element is adjustable.

21. The processor based system of claim 20 wherein said delay time is about 3 to 5 nanoseconds.

22. A method of reducing clock skew comprising the acts of:

providing a first input node for receiving a digital signal;

providing a controllable buffer circuit coupled to the first input node responsive to an enable signal, the controllable buffer circuit providing an output signal in response to the digital signal when the enable signal is in a first state, and the controllable buffer circuit being disabled when the enable signal is in a second state, said buffer circuit having a bias node; and providing a pulser circuit coupled to said bias node for providing a pulse signal to said bias node in response to said enable signal switching to said first state, wherein said pulser circuit comprises a first and second transistor connected in series between said bias node and a source of potential, said first transistor directly receiving said enable signal at a gate thereof, said second transistor receiving said enable signal at a gate thereof after it passes through at least a delay element.

23. The method of claim 22 wherein said first transistor is on and said second transistor is off while said enable signal is in a second state.

24. The method of claim 22 wherein said first transistor is off and said second transistor is on while said enable signal is in a first state.

25. The method of claim 22 wherein a delay time of said delay element is adjustable.

26. The method of claim 25 wherein said delay time is about 3 to 5 nanoseconds.

\* \* \* \* \*